United States Patent [19]

Matsumoto

[11] Patent Number: 5,157,468
[45] Date of Patent: Oct. 20, 1992

[54] LIGHT EMITTING DIODE RESISTANT TO CHANGE IN OPERATING TEMPERATURE

[75] Inventor: Kenji Matsumoto, Kanagawa, Japan

[73] Assignee: Eastman Kodak Company, Rochester, N.Y.

[21] Appl. No.: 742,822

[22] Filed: Aug. 9, 1991

[30] Foreign Application Priority Data

Sep. 21, 1990 [JP] Japan .................................. 2-253858

[51] Int. Cl.$^5$ .......................................... H01L 33/00
[52] U.S. Cl. .................................... 357/17; 357/45; 357/16; 357/28; 357/55; 372/34; 372/50; 372/45; 346/107 R; 313/500; 362/800
[58] Field of Search ............... 357/17, 45, 16, 55, 357/28, 4; 346/107 R, 160, 1.1; 313/500; 362/800; 372/48, 50, 46, 45

[56] References Cited

U.S. PATENT DOCUMENTS

| | | | |
|---|---|---|---|
| 4,982,203 | 1/1991 | Uebbing et al. | 346/107 R |
| 5,020,066 | 5/1991 | Iga et al. | 372/48 X |
| 5,038,356 | 8/1991 | Botez et al. | 357/4 X |
| 5,051,788 | 9/1991 | Tanaka | 357/17 |
| 5,068,868 | 11/1991 | Deppe et al. | 357/4 X |

*Primary Examiner*—William Mintel
*Attorney, Agent, or Firm*—Raymond L. Owens

[57] ABSTRACT

A light emitting diode which does not readily cause an intensity of emitted light to fluctuate even when the operating temperature changes includes a substrate having thereon a light emitting layer and a reflector. The diode includes a light emitting layer which is of a composition which is adapted to generate and radiate light the intensity of which and the light emission spectrum changes of which depend on temperature. Over the light emitting layer is a reflector which is of a composition having a wavelength dependent characteristic which compensates for any such fluctuations in the light intensity and light emission spectrum of the light emitting layer. Direct light from the light emitting layer and light reflected by the reflector can be removed to the exterior of the diode to provide a light emission of uniform intensity even when the diode is subjected to changes in temperature.

30 Claims, 6 Drawing Sheets

LIGHT EMITTING DIODE RESISTANT TO CHANGE IN OPERATING TEMPERATURE

Field of the Invention

The present invention relates to a light emitting diode used to form a light emitting diode array which is suitable as a light source of an electrophotographic printer, and, more particularly, to a light emitting diode having an optical output which is resistant to changes in operating temperature.

Background of the Invention

In general, a light emitting diode utilizing a p-n junction generates heat and raises the temperature of the junction when a current is applied thereto to generate light emission. The intensity of a radiated light beam from a light emitting diode decreases as the temperature thereof increases.

Accordingly, in an electrophotographic printer which utilizes, as a light source, a light emitting diode array comprised of a plurality of light emitting diodes arranged in lines, a difference in operating temperature of respective light emitting diodes is generated. This is a result of the heat generated by the light emitting diodes themselves when the current is applied thereto for light emitting purposes and the heat generated by other parts provided adjacent to the diodes. Namely, a temperature distribution may be generated along the light emitting diode array. In such a case, the intensity of light radiated from respective light emitting diodes becomes non-uniform, causing non-uniform printing or a deterioration in printing quality. Therefore, it has long been desired to develop a light emitting diode whose optical output is resistant to a change in operating temperature.

Referring now to FIG. 1, there is shown an example of a prior art light emitting device 100 which utilizes a light emitting diode array whose optical output is not easily influenced by a change in operating temperature.

Light emitting device 100 supplies light emitted from a light emitting diode array 101 to a photosensitive material 105 through an optical filter 102 having a particular light transmitting characteristic. A rod array lens 103 for collecting the light radiated from the light emitting diode array 101 to the photosensitive material 105 is inserted in front of the light emitting diode array 101. Heat radiating plates (heat sink) 104 are also provided in both sides of the optical filter 102 and the rod array lens 103.

FIG. 2A is a graph showing output light intensity (along the y-axis) versus temperature (°C.) (along the x-axis). FIG. 2B is a graph showing a light emitting spectrum (along the y-axis) versus wavelength (along the x-axis). FIG. 2C is another graph which is similar to the graph shown in FIG. 2A and which shows the output light intensity (along the y-axis) verses temperature (along the x-axis).

As shown by the solid line in FIG. 2A, the light emitting diode array 101 has a characteristic of reducing its optical intensity as the temperature rises. Moreover, as indicated by solid lines in FIG. 2B, the light emitting spectrum of the light emitting diode array 101 has a tendency such that the magnitude of the peak of the emitted light is lowered in response to a rise in temperature and simultaneously the spectrum as a whole shifts toward the side of longer wavelength. Meanwhile, the optical filter 102 has a characteristic, as indicated by a dotted line in FIG. 2B, to allow the light in the side of longer wavelength to transmit.

Therefore, when the optical filter 102 for transmitting light having a long wavelength is provided in front of the light emitting diode array 101 having the characteristic of decreasing in intensity with increase in temperature as shown by the solid line in FIG. 2A and the dotted line in FIG. 2C, the rate of light transmitted to the optical filter 102 to that radiated from the light emitting diode array 101 increases with a rise in temperature. As a result, the light supplied to the photosensitive material 105 has a flat intensity, as indicated by a solid line in FIG. 2C.

The light emitting device 100 thus has a merit in that a change in characteristic in response to a rise in operating temperature of the light emitting diode array 101 can be compensated for by the longer wavelength transmitting-type optical filter 102, and simultaneously has a disadvantage in that the optical filter 102 attenuates the light radiated from the light emitting diode array 101 thereby reducing the intensity of light supplied to the photosensitive material 105. Accordingly, the light emitting device 101 shown in FIG. 1 is not suitable for a light source of a high speed electrophotographic printer which requires higher intensity of light.

Summary of the Invention

The present invention is directed to a light emitting diode having an optical output which is resistant to changes in operating temperature.

More particularly, the present invention is directed to a light emitting diode which comprises a light emitting layer of a composition which is adapted to generate and emit light the intensity and spectrum of which fluctuates in response to a change in temperature. The diode further comprises a reflector of a composition having a light wavelength depending characteristic for compensating a change in intensity and spectrum of light emitted by the light emitting layer. The reflector is across the light emitting layer so that light directly coming from the light emitting layer and light radiated by the light emitting layer and then reflected by the reflector are emitted from the diode.

The light emitting layer of the light emitting diode of the present invention has a characteristic of changing the intensity and spectrum of light in accordance with temperature. Meanwhile, the reflector has a light wavelength dependent characteristic for compensating a change, depending on temperature, in intensity and spectrum of light radiated from the light emitting layer. Therefore, a fluctuation in light emitting characteristic of a light emitting layer depending on temperature is cancelled by the light wavelength characteristic of the reflector when the direct light from the light emitting layer and the light radiated from the light emitting layer and then reflected by the reflector are emitted from the diode.

As explained above, the intensity of light emitted from the light emitting diode of the present invention is resistant to a change in operating temperature due to environment temperature, self heat generation and heat generation of other peripheral parts, and, moreover, provides a comparatively larger optical output than that of the existing light emitting diode.

In the case where a light emitting diode array is formed by arranging the light emitting diodes of the present invention in lines, it is also possible to obtain a light emitting diode array which is resistant to any influence by heat generated and by other parts and which does not produce unevenness in printing due to temperature fluctuations. Consequently, such a light emitting diode array is a suitable light source of an electrophotographic printer which can achieve high quality printing which does not suffer from problems of unevenness. Moreover, since the light emitting diode array has high brightness, it can also be used for a light source of a high speed electrophotographic printer.

The aforementioned and other features and advantages of the present invention will become more apparent from the following description made with reference to the accompanying drawings.

It should be understood that the drawings are not necessarily drawn to scale.

DETAILED DESCRIPTION

Figure 3:
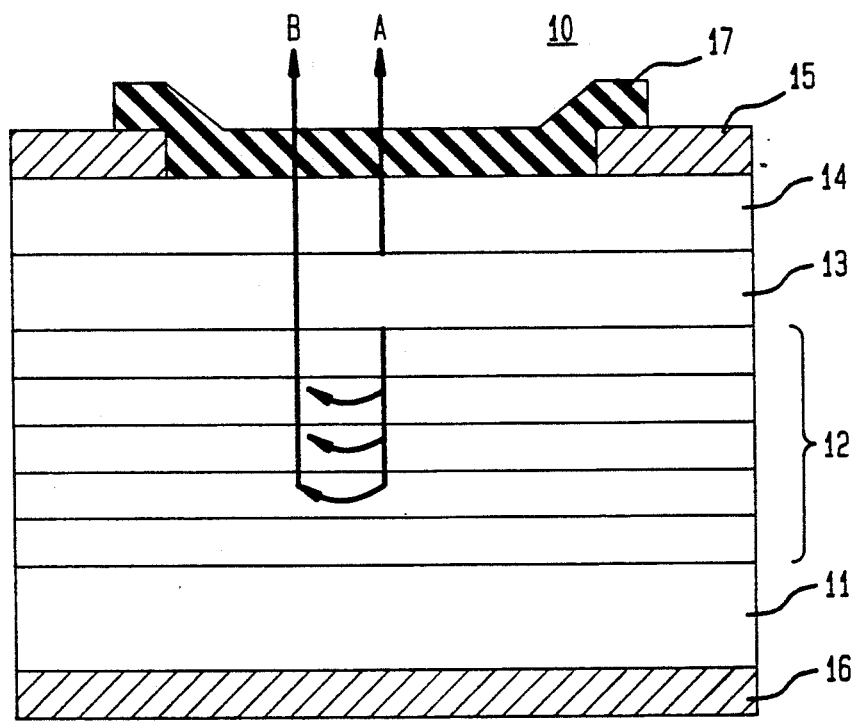
FIG. 3 shows a cross-sectional view of a light emitting diode in accordance with the present invention.

Referring now to FIG. 3, there is shown a cross-sectional view of a light emitting diode 10 in accordance with the present invention. In FIG. 3 lines A and B indicate the path of the light emitted by the light emitting diode 10 as will be explained in detail later. The light emitting diode 10 comprises a substrate 11 having a distributed-Bragg-reflector 12 on an upper surface thereof. The distributed-Bragg-reflector 12 comprises a multiple of semiconductor film layers having different refractive index. A light emitting layer 13 is on an upper surface of the distributed-Bragg-reflector 12, and a window layer 14, which transmits light emitted from the light emitting layer 13, is on the light emitting layer 13. On an upper surface of the window layer 14 is an upper electrode 15 having a window to transmit the light which is formed. A lower electrode 16 is on a lower surface of the substrate 11. An Anti-reflection coating 17 is on the window layer 14 in the window in the upper electrode 15.

Figure 4A:
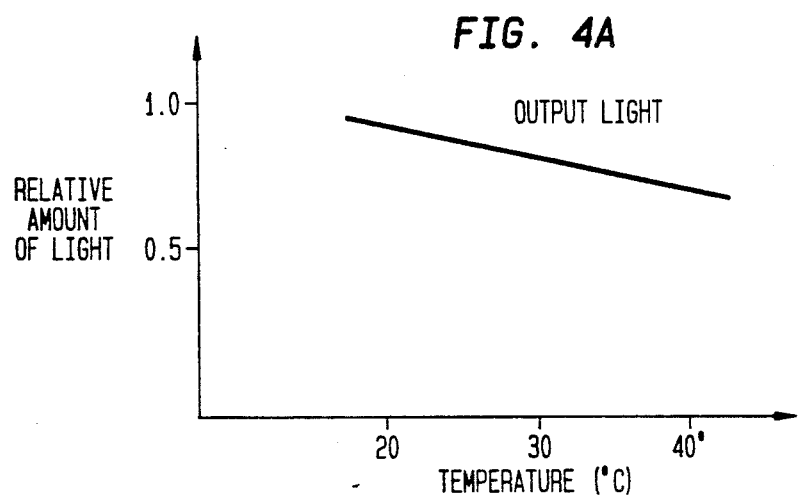
FIG. 4A is a graph of changes in light intensity of the light emitting diode of FIG. 3 alone vs. changes in temperature.
Figure 4B:
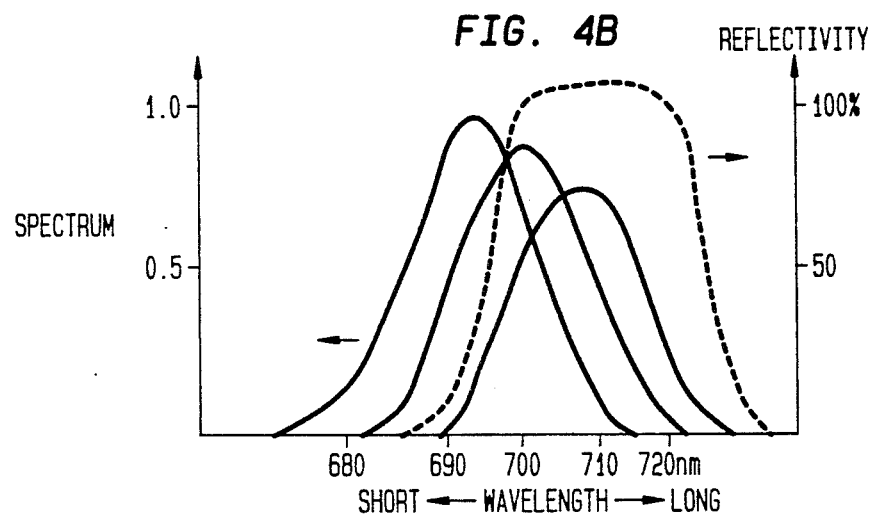
FIG. 4B is a graph showing the emission spectrum of light radiated by the light emitting layer of the light emitting diode of FIG. 3 and the reflectivity of the distributed-Bragg-reflector used in the light emitting diode vs. a light wavelength characteristic of a distribution-type reflector.

Light radiating characteristics of the light emitting layer 13 are shown in FIGS. 4A and 4B. FIG. 4A shows a graph of variation of the light intensity (relative amount of light) emitting from the light emitting layer 13 verses changes in temperature in degrees C. FIG. 4B shows a graph of the spectrum of the emitted light (left side y-axis) verses wavelength (x-axis) as well as the reflectivity of the distributed-Bragg-reflector used in the light emitting diode (right side y-axis) verses wavelength. As shown in FIG. 4A, the intensity of light emitted (output light) from the light emitting layer 13 decreases as temperature increases. The magnitude of a light emission peak, as indicated by the height of the peak of each of the solid lines in FIG. 4B, also decreases in response to a rise in temperature. Simultaneously, the whole emission spectrum moves toward a longer wavelength side, as indicated by the solid lines shifting to the left FIG. 4B. On the other hand, the distributed-Bragg-reflector 12 has a wavelength dependent reflectivity, as indicated by a dotted line in FIG. 4B, which becomes larger in a wavelength longer than the peak wavelength of light emitted from the light emitting layer 13.

Figure 4C:
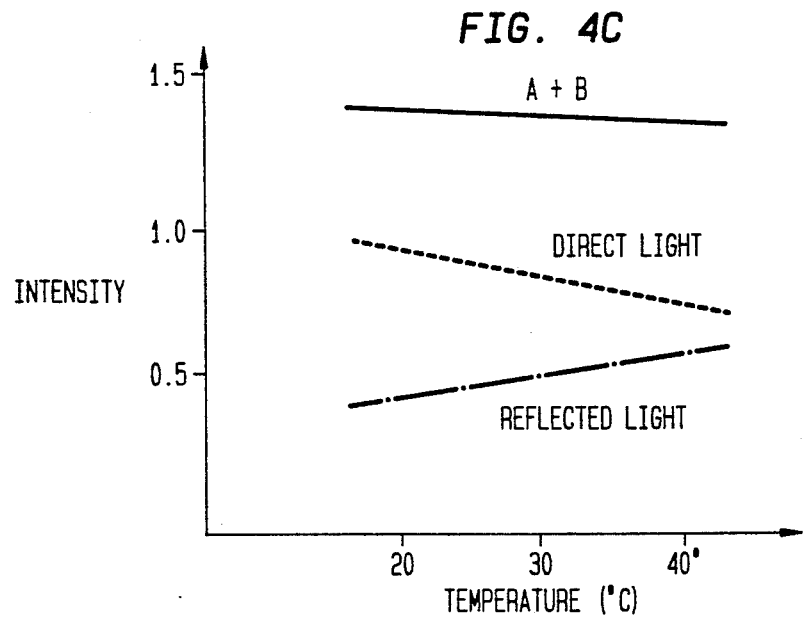
FIG. 4C is a graph showing the temperature dependent characteristic of the intensity of light emitted from the light emitting diode of FIG. 3.

Now, light taken out to the exterior from the light emitting diode 10 will be considered. For this purpose reference should be taken to lines A and B in FIG. 3 and to FIG. 4C, which is a graph showing the intensity of the light emitted by the light emitting diode (y-axis) verses temperature in degrees C. (x-axis). The total emitted light (shown as a solid line denoted as A+B in FIG. 4C) is the sum of light [shown as dashed line A (Direct Light) in FIG. 4C and which will be denoted as light A] which is radiated from the light emitting layer 13, passes through the window and is then radiated directly to the exterior of the diode 10 plus light [as shown in FIG. 4C as a dash-dot line and denoted as B (Reflected Light) and which will be referred to as light B] which goes toward the substrate 11 from the light emitting layer 13 and is then radiated to the exterior after being deflected by the distribution-type reflector 12. Since the light emitting layer 13 has the characteristic explained above, the intensity of the light A received directly from the light emitting layer 13 decreases with increases in temperature, as indicated by the dotted line in FIG. 4C. When the temperature rises, the spectrum of the light emitted from the light emitting layer 13 moves to the longer wavelength side, as indicated by the solid lines in FIG. 4B previously described, whereby more light is reflected by the distributed-Bragg-reflector 12. Accordingly, the intensity of the light B reflected by the distributed-Bragg-reflector 12 increases in response to a rise in temperature, as indicated by the dash-dot line in FIG. 4C. Since the light extracted to the exterior from the light emitting diode 10 is considered to be a sum of the light A and light B, the resulting temperature characteristic of the light intensity becomes essentially flat, as indicated by the solid line A+B in FIG. 4C. Therefore the light emitting diode 10 of FIG. 3 is characterized by an optical output which remains essentially constant with changes in temperature.

Figure 5:
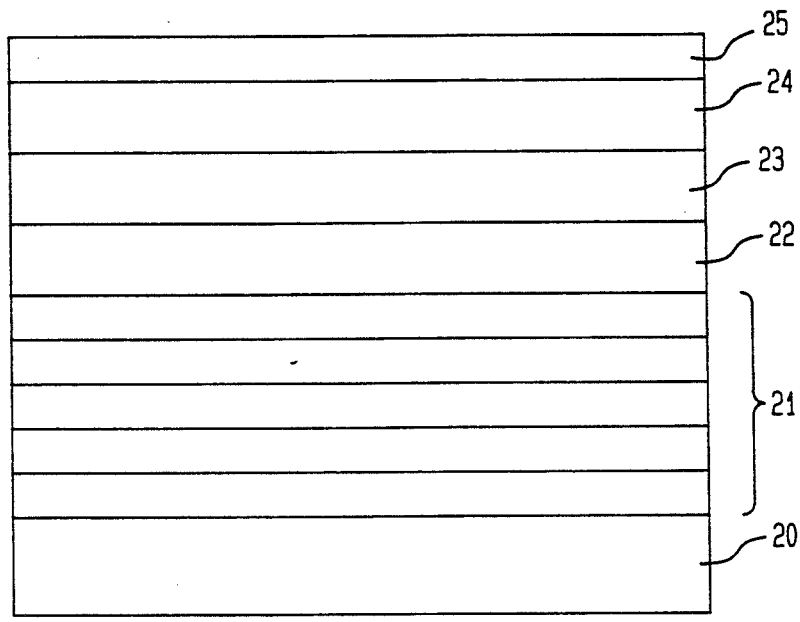
FIGS. 5 and 6 show cross-sectional views illustrating the manufacturing process for another light emitting diode in accordance with the present invention.
Figure 6:
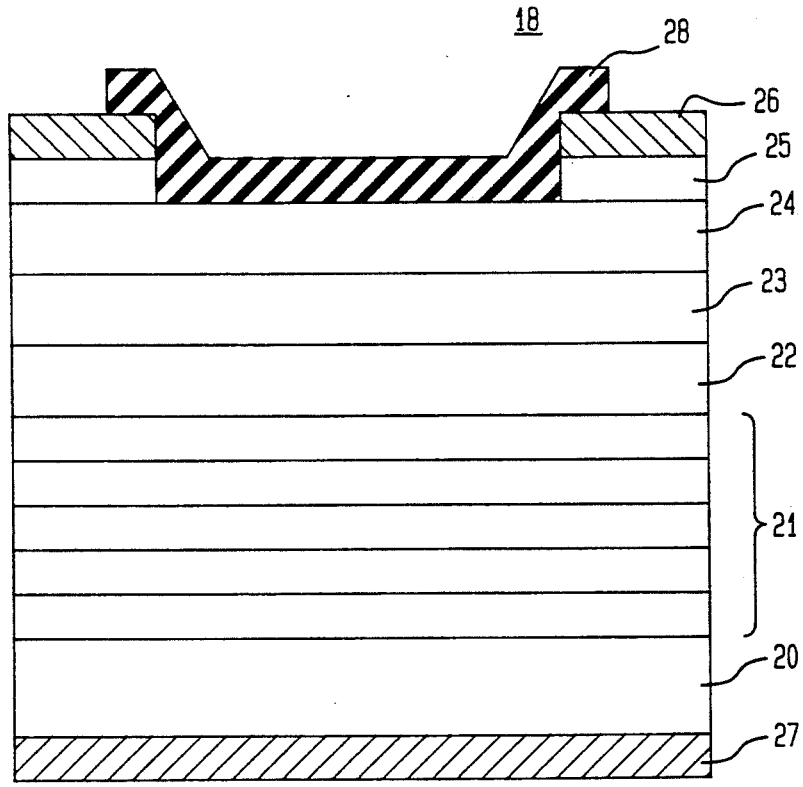

Referring to FIGS. 5 and 6, there are shown cross-sectional views of a light emitting diode 18 in accordance with the present invention during various phases of its manufacture. Light emitting diode 18 is similar to the light emitting diode 10 shown in FIG. 3. First, as shown in FIG. 5, twenty n-type conductivity $Al_xGa_{1-x}As/Al_yGa_{1-y}As$ layers 21 (only five of which are shown) are grown alternately on a substrate 20, generally of n-type conductivity GaAs. Then a first clad layer 22 consisting of the n-type conductivity AlGaAs and of the thickness of 2 μm, a light emitting layer 23 consisting of GaAlAs and of the thickness of 3 μm, a second clad layer 24 serving as a window layer consisting of p-type conductivity GaAlAs and having a thickness of 1 μm and an phmic layer 25 consisting of p-type conductivity GaAs and having a thickness of 0.3 μm are grown in this order on the layers 21. The layers are grown using either a liquid phase epitaxy method, an organic metal growth method or a molecular beam growth method.

The first clad layer 22, the light emitting layer 23 and the second clad layer 24 form a double heterojunction structure in order to ensure a high light emitting efficiency.

Next, as shown in FIG. 6, a window for extracting the light to the exterior is formed by removing a portion of the ohmic layer 25 with a photoresist process and an etching process. Thereafter, with a vacuum evaporation (deposition) method, an electrode 26, consisting of a gold-zinc alloy, is formed on the ohmic layer 25 and an electrode 27, consisting of a gold-germanium alloy, is formed at the lower surface of the substrate 20. Finally, a reflection preventing layer 28 of silicon nitride is formed by a plasma CVD method.

Since, in actual process, a plurality of the light emitting diodes 18 are formed at the same time on each wafer, the respective wafers must be broken apart by dicing to separate the light emitting diodes 18 for mounting in packages.

The light emitting diode of GaAs type semiconductor material explained here is only an example of the semiconductor materials which show light emitting intensities and light emission spectra which change depending on temperature. It is noted that the present invention can be applied to any other semiconductor materials which show such a light emitting intensity and light emission spectra which change depending on temperature.

As explained above, the light emitting diodes 10 and 18 of FIGS. 3 and 6, respectively, are provided with distributed-Bragg-reflectors 12 and 21, respectively, which are made of the semiconductor material. However, it is also possible to employ a multi-layer film consisting of dielectric materials in place of such a reflector.

Figure 7:
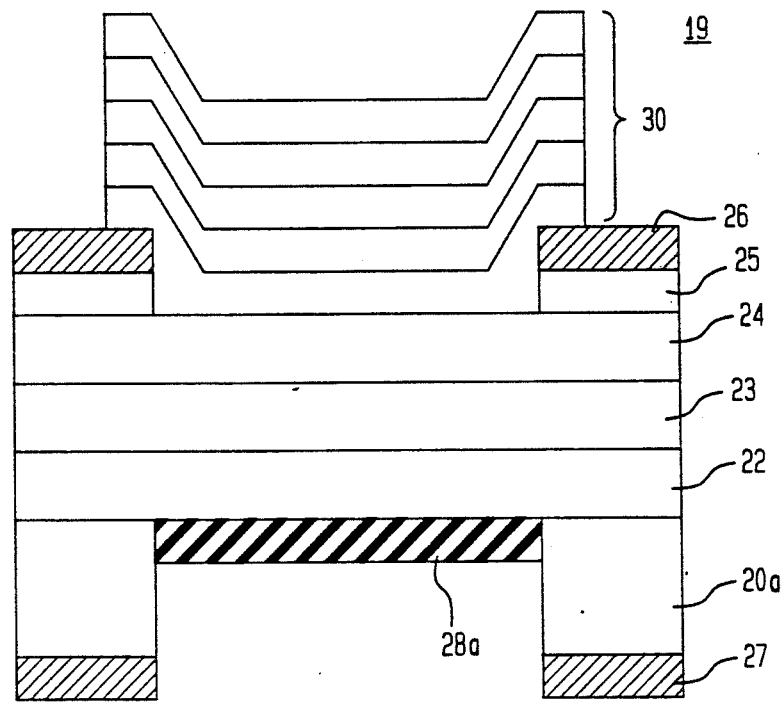
FIG. 7 shows a cross-sectional view of still another light emitting diode in accordance with the present invention.

Referring now to FIG. 7, there is shown a light emitting diode 19 in accordance with the present invention. Diode 19 is provided with a distributed-Bragg-reflector 30 consisting of a dielectric multi-layer film. Elements similar or corresponding to those in the light emitting diode 18 shown in FIG. 6 are designated by the same reference numerals and an explanation of these elements are omitted here.

In the light emitting diode 19 shown in FIG. 7, the distributed-Bragg-reflector 30 is on the surface of the second clad layer 24 in the window formed through the ohmic layer 25. The electrode 26 is on the ohmic layer 25 around the distributed-Bragg-reflector 30. The distributed-Bragg-reflector 30 comprises a multi-layer film of dielectric material having a characteristic inverse to the temperature characteristic of the light emitting layer 23. In order to extract the light radiated from the light emitting layer 23 to the exterior, the substrate 20a has a window therethrough, and a reflection preventing film 28a is formed therein on the first clad layer 22. The electrode 27 is on the surface of the substrate 20a around the window therethrough.

Figure 1:
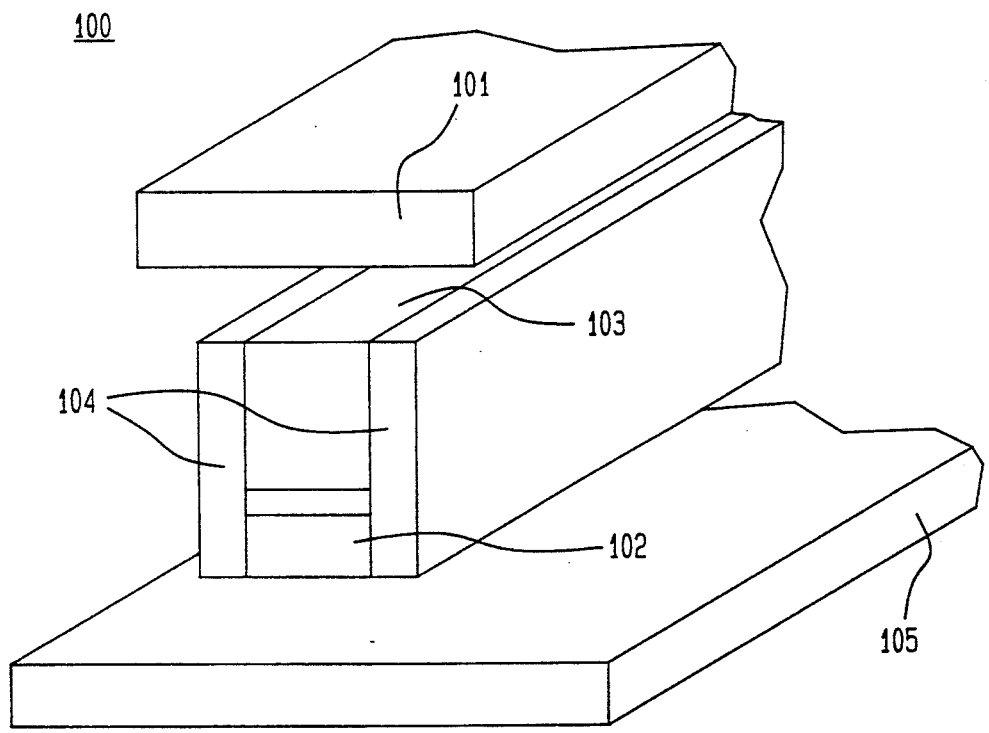
FIG. 1 is a perspective view of a prior art light emitting device having a light emitting characteristic of which is less influenced by a rise in operating temperature.
Figure 2A:
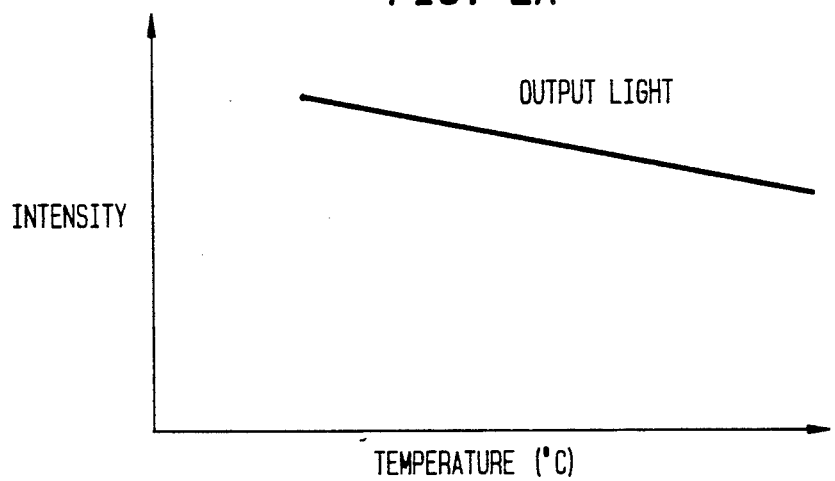
FIGS. 2A, 2B and 2C are graphs which help explain the operation of the light emitting device of FIG. 1 with FIG. 2A being a graph of intensity of light output vs. changes in temperature, FIG. 2B being a graph of changes in spectrum vs. wavelength, and FIG. 2C being a graph of intensity vs. temperature.
Figure 2B:
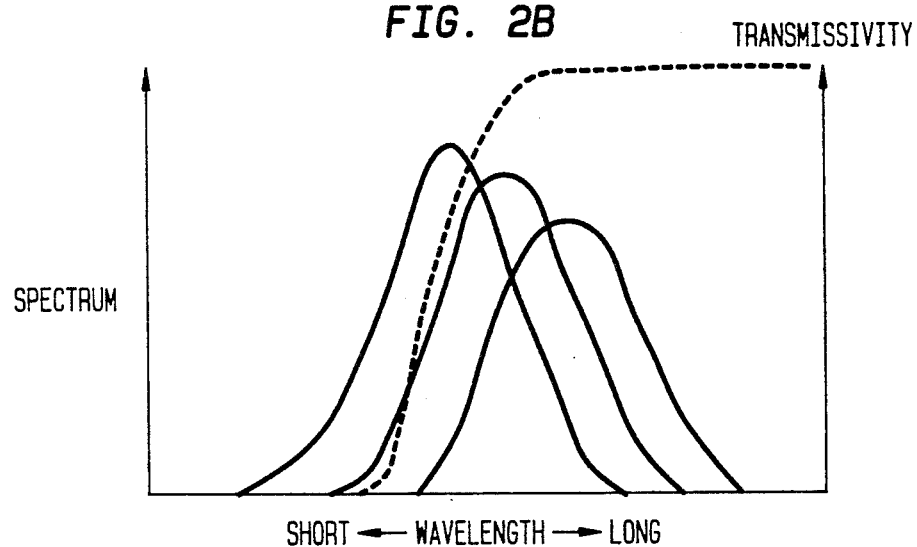
Figure 2C:
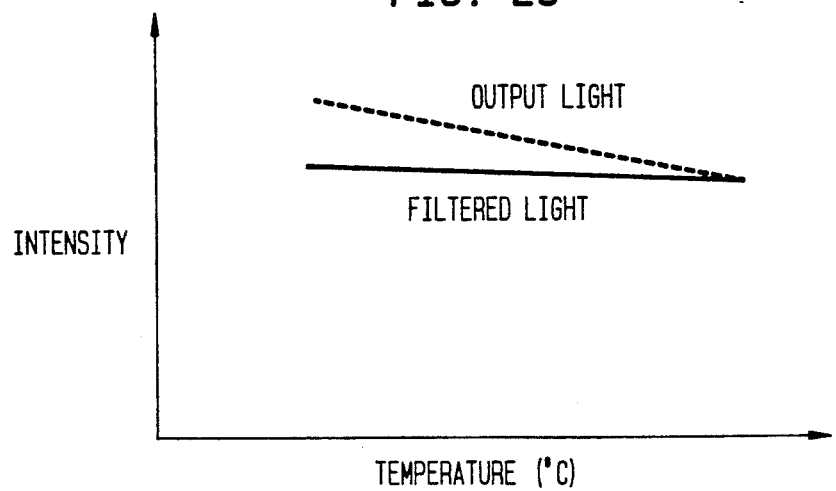

The light emitting diode 19 radiates light having less fluctuation in optical output even when an operating temperature rises, and provides a larger optical output than the prior art diode of FIG. 1.

The distributed-Bragg-reflector 30 consisting of the multi-layer film of dielectric material is not always required to be in the same side as the light emitting layer 24 with reference to the substrate 20.

Figure 8:
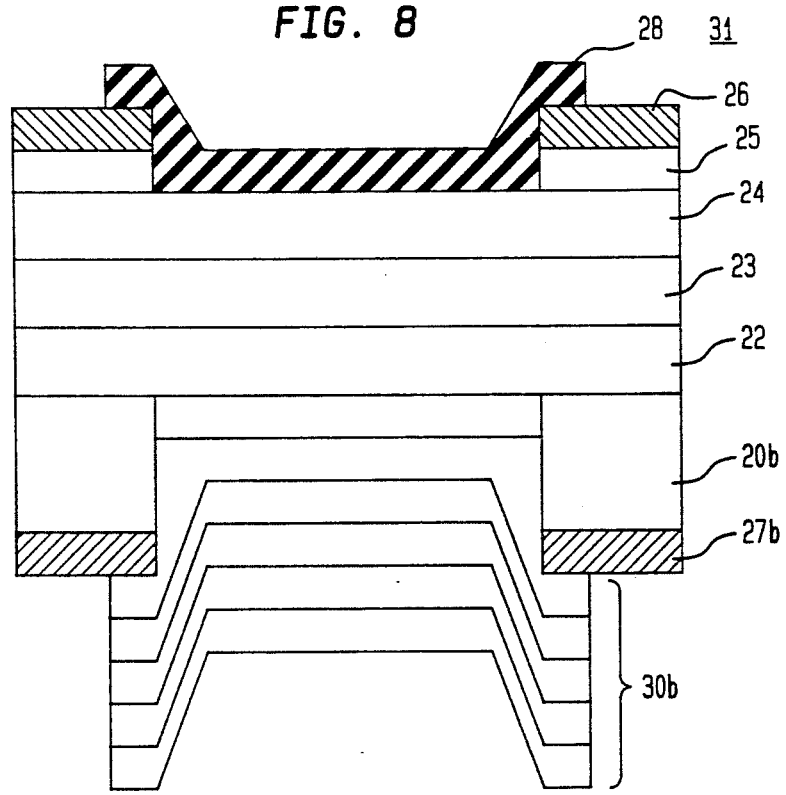
FIG. 8 shows a cross-sectional view of still another light emitting diode in accordance with the present invention.

Referring now to FIG. 8, there is shown a cross-sectional view of a light emitting diode 31 in accordance with the present invention. Diode 31 has a distributed-Bragg-reflector 30b comprising a multi-layer film of dielectric material having the characteristic for compensating the temperature dependent characteristic of the light radiation characteristic of the light emitting layer 23, in a hole formed through the substrate 20b and the electrode 27b. The light emitting diode 31, like diodes 10, 18 and 19 shown in FIGS. 3, 6 and 7, respectively, is characterized by an optical output which is resistant to changes in operating temperature and is an improvement over prior art light emitting device 10 of FIG. 1.

As can be understood from the explanation of the embodiments of the present invention, the light emitting diode of the present invention is characterized by a light emitting layer having a temperature dependent light radiating characteristic and a reflector having a light wavelength characteristic for cancelling a fluctuation in the light radiating characteristic due to a change in an operating temperature. Therefore, the present invention can be applied not only to a light emitting diode having a light emitting layer optical output which drops in response to a rise in operating temperature and a light emission spectrum reflector having a higher reflectivity in a wavelength longer than the peak wavelength of the light emission spectrum, but also to light emitting diodes combining, (1) a light emitting layer having an optical output which drops in response to a rise in operating temperature and a light emission spectrum which moves toward a short wavelength side with a reflector having a higher reflectivity in a wavelength shorter than the peak wavelength of the light emission spectrum;

(2) a light emitting layer having an optical output which increases in response to a rise in operating temperature and a light emission spectrum which moves toward a long wavelength side with a reflector having a higher reflectivity in a wavelength shorter than the peak wavelength of the light emission spectrum; and (3) a light emitting layer having an optical output which increases in response to a rise in operating temperature and a light emission spectrum which moves toward a short wavelength side with a reflector having a higher reflectivity in a wavelength longer than the peak wavelength of the light emission spectrum.

It is to be appreciated and understood that the specific embodiments of the invention are merely illustrative of the general principles of the invention. Various modifications may be made consistent with the principles set forth. For example, the thickness of the various layers of the light emitting diodes may vary and different materials may be used for the various layers.

What is claimed is:

1. A light emitting diode comprising:
   a light emitting layer of a composition which is adapted to generate and emit light, the intensity and spectrum of which fluctuates in response to a change in temperature; and
   a reflector of a composition having a light wavelength dependent characteristic by which temperature dependent fluctuations in intensity and spectrum of light emitted from said light emitting layer is compensated for, said reflector being across said light emitting layer so that direct light emitted from said light emitting layer and light which is radiated from said light emitting layer and is reflected by said reflector are emitted to the exterior of said diode.

2. The light emitting diode of claim 1 further comprising a substrate having a pair of opposed surfaces and said light emitting layer and said reflector are on said substrate.

3. The light emitting diode of claim 2 in which the light emitting layer and the reflector are on the same surface of said substrate.

4. The light emitting diode of claim 3 in which the reflector is of a multilayer film of either a semiconductor or a dielectric.

5. The light emitting diode of claim 2 in which said light emitting layer and said reflector are on opposite surfaces of said substrate.

6. The light emitting diode of claim 5 in which said reflector is of a multilayer film of either a semiconductor or a dielectric.

7. A light emitting diode comprising:
   a light emitting layer of a composition which is adapted to generate and radiate light, the optical output of which drops in response to a rise in operating temperature and the light emission spectrum moves toward a longer wavelength side;
   a reflector located in a position with respect to the light emitting layer to reflect light radiated from said light emitting layer and of a composition having a wavelength dependent reflectivity which becomes larger in a wavelength longer than the peak wavelength of the light emission spectrum of said light emitting layer; and
   a window portion allowing to be admitted to the exterior of the light emitting diode direct light from said light emitting layer and light radiated from said light emitting layer and then reflected by said reflector.

8. The light emitting diode of claim 7 further comprising a substrate having a pair of opposed surfaces and said light emitting layer and said reflector are on said substrate.

9. The light emitting diode of claim 8 in which the light emitting layer and the reflector are on the same surface of said substrate.

10. The light emitting diode of claim 9 wherein said reflector is of a multilayer film of either a semiconductor or a dielectric.

11. The light emitting diode of claim 10 wherein said light emitting diode and said reflector are on opposite surfaces of said substrate.

12. The light emitting diode of claim 11 wherein said reflector is a multilayer film of either semiconductor or a dielectric.

13. A light emitting diode comprising:
   a light emitting layer of a composition adapted to generate and radiate light, the optical output of which drops in response to a rise in operating temperature and a light emission spectrum which moves toward a shorter wavelength side;
   a reflector located at a position with respect to the light emitting layer to reflect light radiated from said light emitting layer and of a composition having a wavelength dependent reflectivity which becomes larger in a wavelength shorter than the peak wavelength of the light emission spectrum of said light emitting layer; and
   a window portion allowing the passing to the exterior of said diode direct light from said light emitting layer and light radiated from said light emitting layer and then reflected by said reflector.

14. The light emitting diode of claim 13 further comprising a substrate having a pair of opposed surfaces and said light emitting layer and said reflector are on said substrate.

15. The light emitting diode of claim 14 in which the light emitting layer and said reflector are on the same surface of said substrate.

16. The light emitting diode of claim 15 wherein said reflector is a multilayer film of either a semiconductor or a dielectric.

17. The light emitting diode of claim 14 in which said light emitting diode and said reflector are on opposite sides of said substrate.

18. The light emitting diode of claim 17 wherein said reflector is a multilayer film of either a semiconductor or a dielectric.

19. A light emitting diode comprising:
   a light emitting layer of a composition adapted to generate and radiate light, the optical output of which increases in response to a rise in operating temperature and a light emission spectrum which moves toward a longer wavelength side;
   a reflector located at a position with respect to the light emitting layer to reflect light radiated from said light emitting layer and of a composition having a wavelength dependent reflectivity which becomes larger in a wavelength shorter than the peak wavelength of the light emission spectrum of said light emitting layer; and
   a window portion allowing to pass to the exterior of said diode direct light from said light emitting layer and light radiated from said light emitting layer and then reflected by said reflector.

20. The light emitting diode of claim 16 further comprising a substrate having a pair of opposed surfaces and said light emitting layer and said reflector are on said substrate.

21. The light emitting diode of claim 20 wherein the light emitting layer and the reflector are on the same surface of said substrate.

22. The light emitting diode of claim 21 wherein the reflector is of a multilayer film of either a semiconductor or a dielectric.

23. The light emitting diode of claim 20 wherein said light emitting diode and said reflector are on opposite surfaces of said substrate.

24. The light emitting diode of claim 23 wherein said reflector is a multilayer film of either a semiconductor or a dielectric.

25. A light emitting diode comprising:
   a light emitting layer of a composition which is adapted to generate and radiate light, the optical output of which increases with a rise in operating temperature and a light emission spectrum which moves toward a shorter wavelength side;

a reflector located at a position with respect to the light emitting layer to reflect light radiated from said light emitting layer and of a composition having a wavelength dependent reflectivity which becomes higher in a wavelength longer than the peak wavelength of the light emission spectrum of said light emitting layer; and a window portion allowing the passing to the exterior of said diode direct light from said light emitting layer and light radiated from said light emitting layer and then reflected by said reflector.

26. The light emitting diode of claim 25 further comprising a substrate having a pair of opposed surfaces and the light emitting layer and the reflector are on said substrate.

27. The light emitting diode of claim 26 wherein said light emitting layer and said reflector are on the same surface of said substrate.

28. The light emitting diode of claim 27 wherein the reflector is of a multilayer film of either a semiconductor or a dielectric.

29. The light emitting diode of claim 26 wherein said light emitting diode and said reflector are on opposite surfaces of said substrate.

30. The light emitting diode of claim 29 wherein said reflector is a multilayer film of either a semiconductor or a dielectric.

* * * * *